United States Patent [19]

Usami et al.

[11] Patent Number: 5,307,322

[45] Date of Patent: Apr. 26, 1994

[54] MEMORY CELL FOR USE IN A MULTI-PORT RAM

[75] Inventors: Kimiyoshi Usami; Yukinori Muroya, both of Kanagawa, Japan

[73] Assignee: Kabushiki Kaisha Toshiba, Kawasaki, Japan

[21] Appl. No.: 908,263

[22] Filed: Jul. 2, 1992

[30] Foreign Application Priority Data

Jul. 3, 1991 [JP] Japan .................................. 3-162871

[51] Int. Cl.⁵ ............................................. G11C 11/34
[52] U.S. Cl. ............................... 365/230.05; 365/154; 365/190; 365/189.04
[58] Field of Search ................... 365/154, 190, 189.04, 365/230.05

[56] References Cited

U.S. PATENT DOCUMENTS

| | | | |
|---|---|---|---|
| 4,667,310 | 5/1987 | Takada | 365/154 |
| 4,768,172 | 8/1988 | Sasaki | 365/230.05 |
| 5,060,192 | 10/1991 | Young et al. | 365/190 |
| 5,216,636 | 6/1993 | Runaldue | 365/230.05 |

FOREIGN PATENT DOCUMENTS

| | | | |
|---|---|---|---|
| 63-197088 | 8/1988 | Japan | 365/154 |
| 177195 | 7/1990 | Japan | 365/154 |

*Primary Examiner*—Eugene R. LaRoche
*Assistant Examiner*—Andrew Tran
*Attorney, Agent, or Firm*—Foley & Lardner

[57] ABSTRACT

A memory cell is provided for use in a multi-port RAM. In addition to a flip-flop circuit for memorizing data and a transfer gate for transmitting data into the flip-flop, at least a transistor series having a first, a second, and a third field effect transistors are provided. These transistors are series connected between a bit line of said RAM and a low electric supply so as to read out data from said flip-flop circuit within a short period.

12 Claims, 5 Drawing Sheets

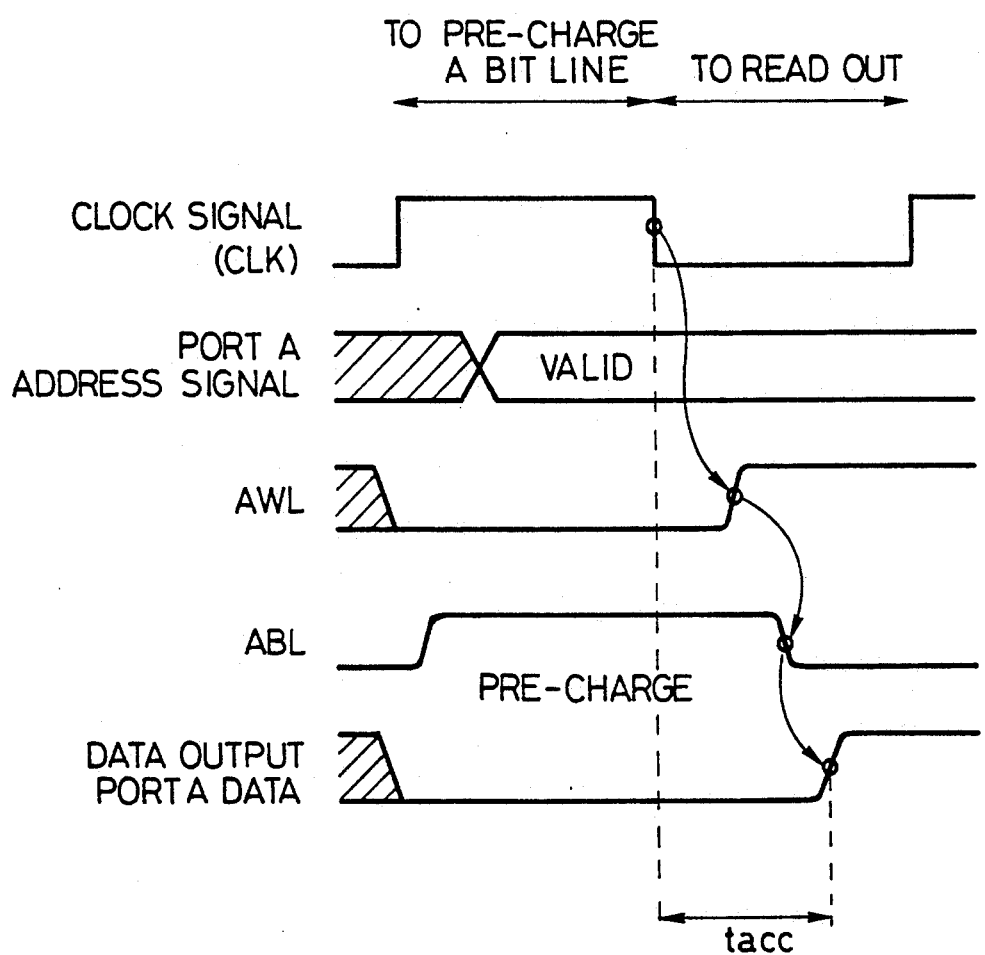

MEMORY CELL FOR USE IN A MULTI-PORT RAM

BACKGROUND OF THE INVENTION

1. Field of the Invention

This invention relates to a memory cell for use in a multi-port RAM in which data are read out synchronous with a clock signal. In particular, it relates to a memory cell for use in a multi-port RAM which is used as an element for constructing a high speed logic LSI, such as a processor.

2. Description of the Prior Art

An example of a multi-port RAM which is used, for example, in a processor system and operated synchronously with a clock signal, is shown in FIG. 4.

The RAM shown in FIG. 4 has read only ports A and B, and a write only port C. This RAM also has word lines AWL, BWL, and CWL, and bit lines ABL, BBL, CBL and /CBL for a memory cell 1. Word line AWL and bit line ABL correspond to port A, word line BWL and bit line BBL correspond to port B, and word line CWL and bit lines CBL and /CBL correspond to port C.

Memory cell 1 is comprised of the following: a flip flop (F/F) circuit 2 to memorize data obtained from write only bit lines; a first series of transistors including N channel FET (referred to as N-FET, below) A1 and N-FET A2; and a second series of transistors including N-FET B1 and N-FET B2. In this memory cell, the gate of said N-FET A1 is connected with a node NA of F/F circuit 2, and the gate of N-FET A2 is connected with word line AWL. These two N-FETs are inserted between bit line ABL and the ground in order to read out data from port A. In the same way, N-FET B1 and N-FET B2 are provided corresponding to node NB and word line BWL and inserted between bit line BBL and the ground.

Stored data in memory cell 1 are read out through input-output circuit 3, in which an N-FET A3, a P channel FET (referred to as P-FET, below) A4, an N-FET B3, and a P-FET B4 are provided. These, transistors perform pre-charge for bit lines ABL and BBL in synchronism with the clock signal.

In memory cell 1, each word line AWL, BWL, or CWL is selected by address decoder 4. In other words, address decoder 4 decodes each port address signal under the control of the clock signal and selectively indicates a corresponding word line.

Next, the data read out processing from port A will be explained in the structure with reference to the timing chart shown in FIG. 5.

During a period in which clock signal CLK is in a high level, word line AWL has a low level, and FETs A3 and A4 for pre-charge become conductive. As a result, bit line ABL becomes a high level and is allowed to be pre-charged.

If the clock signal becomes low level in the situation as shown in FIG. 5, the address signal from port A, which has been fixed and given to address decoder 4 at the very early stage in the high level state of the clock signal, is decoded by address decoder 4. At the same time, FETs A3 and A4 for pre-charge become non-conductive.

As the result of the decoding, that is, when word line AWL is selected to be a high level in the condition where high level data are stored in node NA of memory cell 1, N-FETs A1 and A2 become conductive. Thus, bit line ABL becomes conductive, allowing port A data having a high level to be read out through input-output circuit 3.

In such a read out processing, the address signal in port A is fixed considerably before the clock signal becomes a low level, that is, an enable state in which a read out processing is allowed. If the clock signal is in a high level, the fixed address signal cannot be decoded to make word line AWL be a high level, because bit line ABL has already been pre-charged. In other words, the decoding of an address signal is allowed only when the clock signal is in an enable state because it is controlled by the clock signal.

As described above in a prior art multi-port RAM shown in FIG. 4, the read out processing is carried out is synchronism with the clock signal. In other words, although an address signal has been fixed and given to an address decoder considerably before the clock signal reaches the enable state, the decoding of the address signal to selectively specify a certain word line should be postponed until the clock signal reaches the enable state. Accordingly, the access time ($t_{acc}$), which begins when the clock signal reaches the enable state and ends when data are read out, includes the address decoding time, thus causing a difficulty in executing a read out processing with high speed.

SUMMARY OF THE INVENTION

This invention has been made to overcome the above mentioned problem of the prior art device.

Therefore, the main objective of the present invention is to provide a memory cell for use with a multi-port RAM, the memory cell in which a high speed read out processing is accomplished in synchronism with a clock signal.

Another objective of the present invention is to provide a memory cell for use with a multi-port RAM, the memory cell which is constructed so as to execute a high speed read out processing, without largely increasing the amount of electric power consumption as well as the number of structure elements.

The first feature of the present invention, therefore, provides a memory cell for use in a multi-port RAM, the memory cell which is comprised of the following: a flip-flop circuit to memorize data; at least one first transistor series having a first, a second, and a third field effect transistors which are series connected between a bit line of the multi-port RAM and a low electric supply; and at least one transfer gate for transmitting input data into the flip-flop circuit; wherein the first transistor being controlled to be conductive in accordance with data stored in the flip-flop circuit; the second transistor being controlled to be conductive by an address decode signal, which specifies read out data, when the data stored in the flip-flop circuit; and the third transistor being controlled to be conductive by a clock signal which reaches an enable state after the second transistor has become conductive.

According to the structure, the second transistor is made to be conducive by an address decode signal which specifies read out data, before the clock signal reaches an enable state. As soon as the clock signal reaches the enable state, the third transistor is allowed to conduct. Thus, data are read out through the first and the second transistors which have been made conductive. It is, thus, possible to read out data with high speed.

BRIEF DESCRIPTION OF THE DRAWINGS

FIG. 5 is a chart showing the read out timing in said RAM shown in FIG. 4.

DETAILED DESCRIPTION OF THE EMBODIMENTS

Embodiments of the present invention will be illustrated below by referring to figures.

Figure 1:
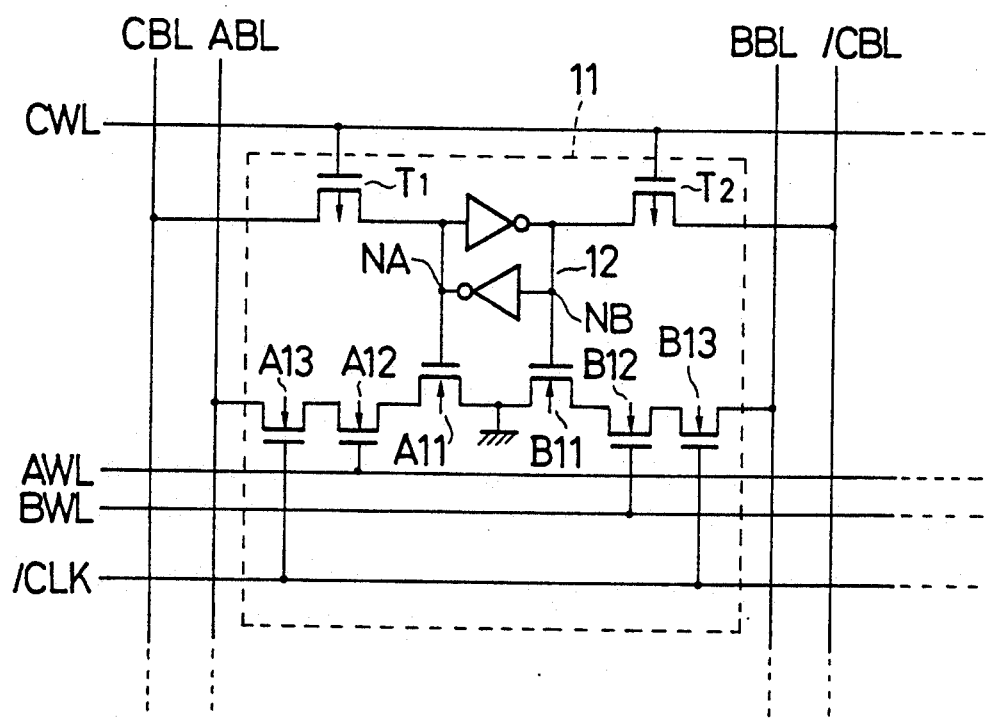
FIG. 1 is a circuit diagram showing the structure of a memory cell according to one embodiment of the present invention.
Figure 2:
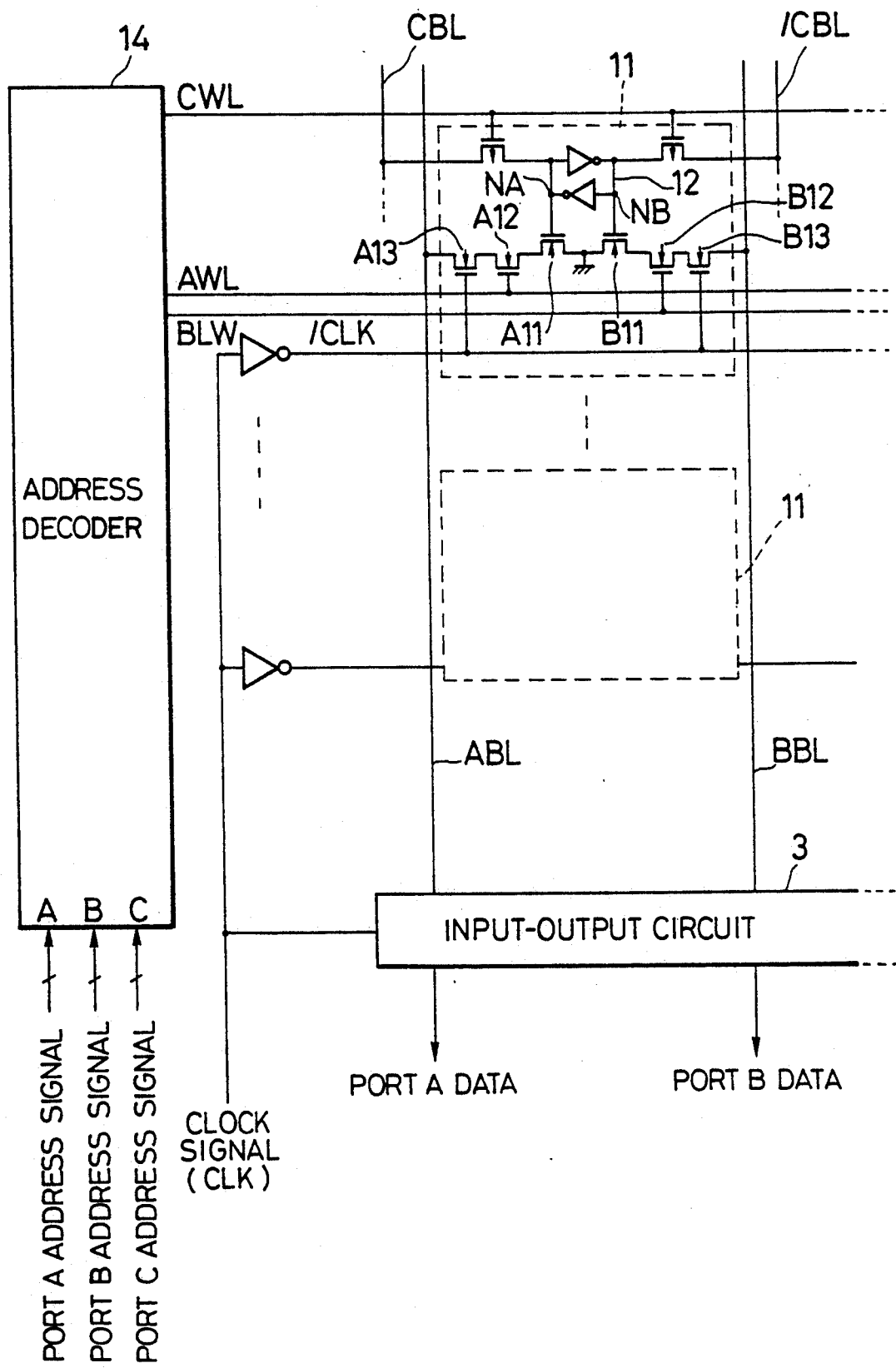
FIG. 2 is a circuit diagram showing the main part structure of a multi-port RAM in which said memory cell shown in FIG. 1 is used.

FIG. 1 shows the circuit structure of a memory cell for use in a multi-port RAM according to one embodiment of the present invention. FIG. 2 shows the main part structure of a three-port RAM in which the memory cell shown in FIG. 1 is included. The embodiment shown in FIGS. 1 and 2 has been made to be used in a three-port RAM having the same port structure as that shown in FIG. 4. In these RAMs, data are read out in synchronism with clock signals. The memory cell of this embodiment is constructed to select and indicate word lines of read-out data in said RAM without being restricted by the state of clock signals.

First, the structure of a memory cell, by which the present invention is characterized, will be described by referring to FIG. 1.

As shown in FIG. 1, a memory cell 11 is comprised of the following: a flip-flop (F/F) circuit 12 for memorizing data; a first series of three N-FETs A11, A12, and A13 corresponding to a read-only port A; and a second series of three N-FETs B11, B12, and B13 corresponding to a read-only port B.

In actual, the first transistor series for port A is comprised of the following: N-FET A11 whose gate is connected with a node NA of F/F circuit 12; N-FET A12 whose gate is connected with a word line AWL for port A; and N-FET A13 in which an inverted signal (/CLK) obtained from a clock signal is given to its gate. In the first transistor series, these three transistors are connected in series between a bit line ABL for port A and the ground.

On the other hand, the second transistor series for port B is comprised of the following: N-FET B11 whose gate is connected with a node NB of F/F circuit 12; N-FET B12 whose gate is connected with a word line BWL for port B; and N-FET B13 in which the inverted signal (/CLK) obtained from the clock signal is given to its gate. In this second transistor series, these three transistors are connected in series between a bit line BBL for port B and the ground.

Memory cell 11 further includes transfer gates T1 and T2, which are transmit data into said F/F circuit 12. In this embodiment, these gates T1 and T2 are made of P-FETs as shown in FIG. 1.

As shown in FIG. 2, a plurality of the memory cells 11, 11 ... are arranged in the form of a matrix to construct a memory for a three port RAM. This three port RAM further includes the following: an input-output circuit 3 which has the same structure as that shown in FIG. 4; and an address decoder 14 in which each port address signal is decoded so as to select a corresponding word line. In this address decoder, however, no clock signal is input.

Figure 3:
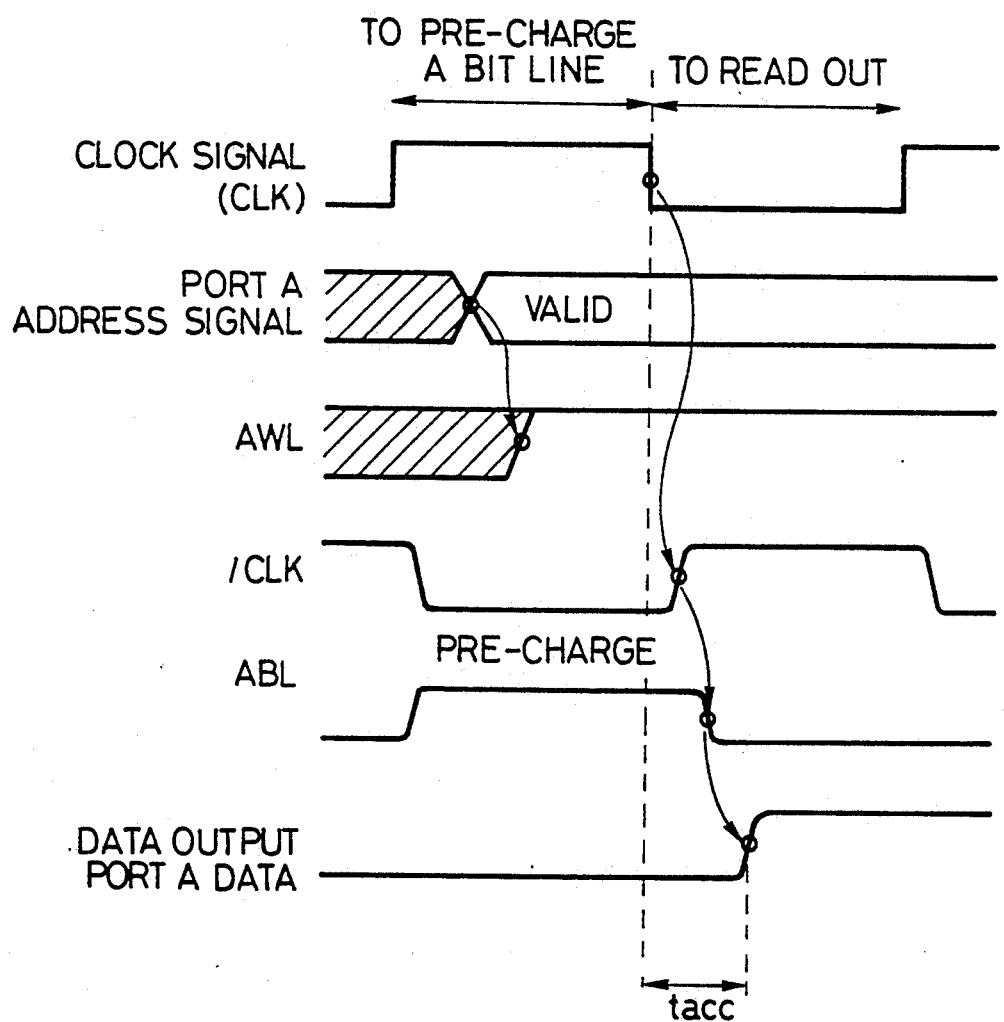
FIG. 3 is a chart showing the read out timing in said RAM shown in FIG. 2.

A read-out processing regarding port A in such a RAM constructed as mentioned above will be described below by referring to the timing chart shown in FIG. 3.

Figure 4:
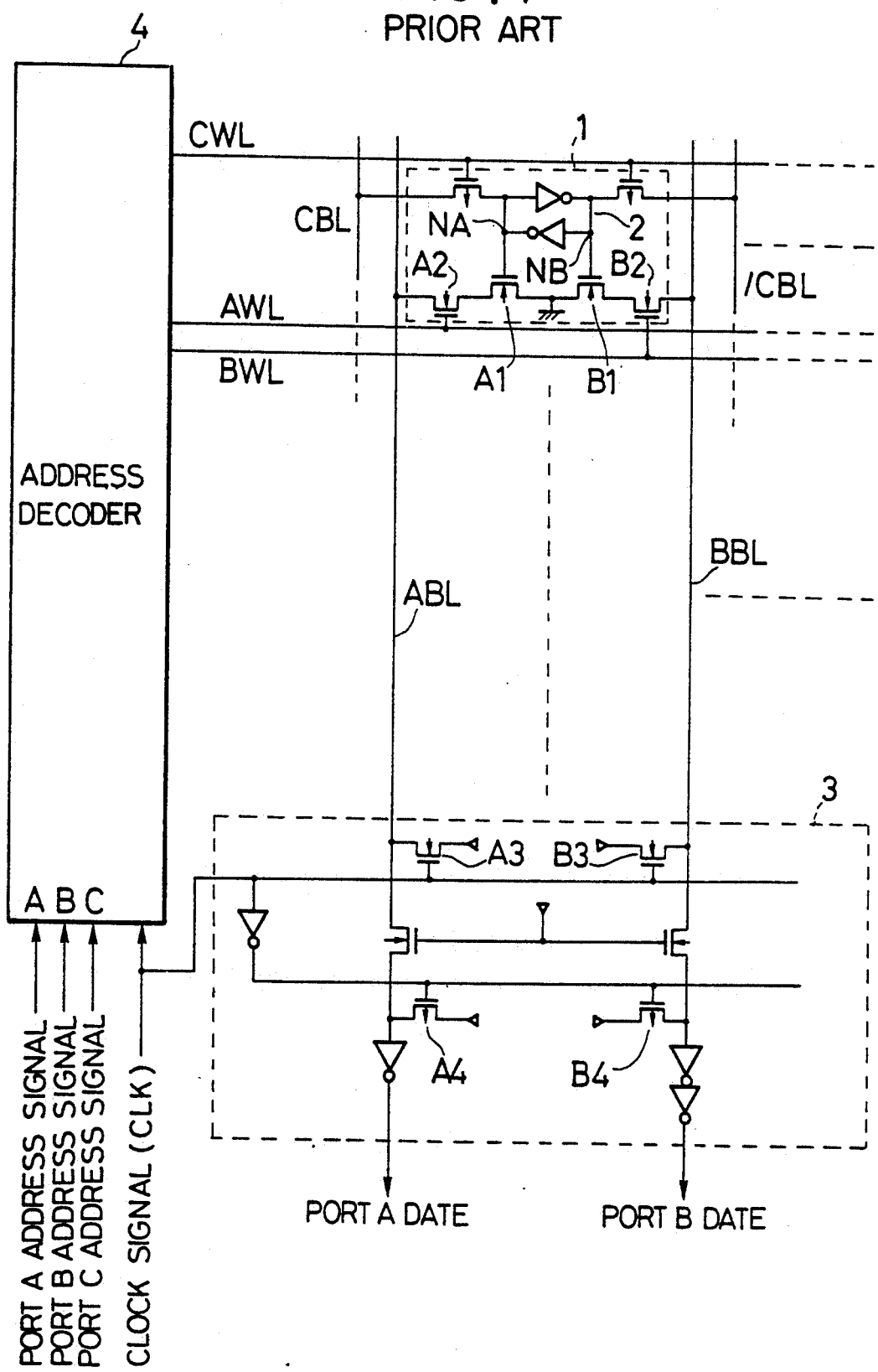
FIG. 4 is a circuit diagram showing the main part structure of a multi-port RAM according to the prior art.

In the case where clock signal CLK is in a high level, bit line ABL is first pre-charged into a high level by precharge transistors in input-output circuit 3 shown in FIG. 4.

In this situation, if an address signal is given to address decoder 14 from port A considerably before the clock signal becomes an enable state (a low level in this case), this address signal is immediately decoded by address decoder 14 regardless of the state of clock signal. Once said address signal has been completely decoded, word line AWL corresponding to said address signal becomes a high level to indicate that line AWL is selected. As a result, N-FET A12 connected with word line AWL in memory cell 11 becomes conductive.

In the processing, it is required that an address signal from port A be given to address decoded 14 considerably before the clock signal becomes a low level. In this case, the address signal is decoded in address decoder 14 to raise the level of word line AWL.

As mentioned above, one feature of the present invention is in the following fact. That is, before the clock signal indicates a read out processing, the address of read out data is fixed to select and indicate corresponding word line AWL. In this situation, bit line ABL stays in a pre-charge state. In the series connected transistors, however, N-FET A13, in which an inverted clock signal is given to its gate, is in a non-conductive state. Consequently, although N-FET A11 has been made conductive by giving high level data into node NA, the voltage level of bit line ABL is not affected by the state of N-FET A12. As a result, although the bit line has been pre-charged, the word line can be set to a high level to indicate that it is selected.

Once the word line is set to a high level as the result of a selection, a data read out processing is carried out when the clock signal changes its state from a high level to a low level. At this moment, the inverted clock signal becomes a high level, thus ceasing the pre-charge on bit line ABL. When the inverted clock signal becomes a high level, N-FET A13 becomes conductive. In this case, if node NA is in a high level state, three N-FETs A11, A12, and A13 become conductive. As a result, the electric charges on bit line ABL are released to the ground through N-FETs A11, A12, and A13, thus decreasing the voltage level of bit line ABL from a high level to a low level. This voltage decrease is detected by input-output circuit 3, and so high level data are output from input-output circuit 3.

In the embodiment mentioned above, the memory cell size increases about 10% as compared with that of the prior art shown in FIG. 4. In this embodiment, however, an address can be fixed to select and specify a corresponding word line considerably before the clock signal reaches an enable state. Thus, as soon as the clock signal becomes enable, data can be read out by removing charges on the bit line. Consequently, the data read out from cells of this embodiment can be accomplished about 30% faster than that in the prior art.

In the same manner as that of the prior art device, steady current does not flow in the memory cell of this embodiment during the pre-charge of bit lines and read out processings. Therefore, a read out processing can be executed in this embodiment, without increasing the amount of electric consumption as compared with that of the prior art device.

Further, address signals are decoded without considering the level of the clock signal. The structure of address decoder 14 can, therefore, be made simpler than that of the prior art device.

It should be noted that this invention is not limited to the embodiment mentioned above. For example, the conductivity of transistors, which are included in memory cell 1, can be altered to P channel instead of N channel.

Also, the input-output circuit and the address decoder can be made in any structure so far as having basic functions. This is because these do not compose the characteristic structure of the present invention.

In summary, according to the present invention, a data specifying process is completed before a clock signal becomes enable. As a result, data are ready to be read out from the memory cell of this invention when the clock signal is set to an enable state. In other words, data are read out only by discharging a certain bit line when the clock signal is set to an enable state. So, in the RAM using memory cells of the present invention, the data read out processing can be accomplished faster than that of the prior art device, without increasing the electric consumption and the number of structure elements so much.

What is claimed is:

1. A memory cell for use in a multi-port RAM, the cell comprising:
    a flip-flop circuit to memorize data;
    at least one first transistor series having a first, a second, and a third field effect transistors which are series connected between a bit line of said multi-port RAM and a low electric supply; and
    at least one transfer gate for transmitting input data into said flip-flop circuit; wherein said first transistor being controlled to be conductive in accordance with data stored in said flip-flop circuit;
    said second transistor being controlled to be conductive by an address decode signal, which specifies read out data, when said data stored in said flip-flop circuit is read out; and
    said third transistor being controlled to be conductive by a clock signal which becomes an enable state after said second transistor has become conductive.

2. The memory cell for use in a multi-port RAM as claimed in claim 1, wherein the same number of said transistor series as that of the read-only ports in said multi-port RAM are provided.

3. The memory cell for use in a multi-port RAM as claimed in claim 1, wherein said first, second, and third transistors are comprised of N-channel field effect transistors respectively.

4. The memory cell for use in a multi-port RAM as claimed in claim 1, wherein said first, second, and third transistors are comprised of P-channel field effect transistors respectively.

5. The memory cell for use in a multi-port RAM as claimed in claim 1, wherein the gate of said first transistor is connected with one node of said flip-flop circuit, and the gate of said second transistor is connected with a word line of said multi-port RAM, and wherein an inverted clock signal for said multi-port RAM is input to the gate of said third transistor.

6. The memory cell for use in a multi-port RAM as claimed in claim 1, wherein said transfer gate is comprised of a field effect transistor which is inserted between a bit line for data writing in said multi-port RAM and one node of said flip-flop circuit.

7. The memory cell for use in a multi-port RAM as claimed in claim 1, wherein said low electric supply is comprised of the ground potential.

8. A memory cell for use in a multi-port RAM which has an address decoder having at least a first and a second read-only port and a write-only port, the cell comprising:
    a flip-flop circuit to memorize data;
    a first transistor series having first, second, and third field effect transistors which are series connected between a bit line corresponding to said first read-only port and a low electric supply;
    a second transistor series having first, second, and third field effect transistors which are series connected between a bit line corresponding to said second read-only port and said low electric supply; and
    a first and a second transfer gates for transmitting input data into said flip-flop circuit;
    wherein, in said first transistor series, said first transistor being controlled to be conductive in accordance with data stored in said flip-flop circuit;
    said second transistor being controlled to be conductive by an address decode signal output from said first read-only port, whenever said data stored in said flip-flop circuit is read out;
    and in said second transistor series, said first transistor being controlled to be conductive in accordance with said data stored in said flip-flop circuit in a manner which is opposite to the control of said first transistor series;
    said second transistor being controlled to be conductive by an address decode signal output from said second read-only port, whenever said data stored in said flip-flop circuit is read out; and
    said third transistors in said first and second transistor series being controlled to be conductive respectively by a clock signal which reaches an enable state after said second transistors have become conductive.

9. A multi-port random access memory comprising:
    a plurality of first word lines;
    a plurality of second word lines;
    a plurality of first bit lines;
    a plurality of second bit lines;
    a plurality of memory elements for storing binary data in the form of high and low level signal which can be addressed through said first and second word lines and accessed through said first and second bit lines,
    each memory element comprising a flip-flop circuit for latching one bit signal of said binary data,
    a first transistor connected between said flip-flop circuit and one of said first bit lines with a gate terminal being connected to one of said first word lines,
    second and third transistors connected in series between one of said second bit lines and a first voltage source corresponding to one of said high and low level signals, said second transistor having a gate terminal connected to said flip-flop circuit and being turned on or off in accordance with the data stored in said memory element, said third transistor having a gate terminal connected to one of said second word lines and being turned on or off in accordance with an addressing signal on said one of said second word lines;

an address decoder connected to said first and second word lines for supplying an addressing signal to said first transistors through one of said first work lines to transfer signals on said first bit lines respectively to said flip-flop circuits connected to said one of said first word lines and for supplying an addressing signal to said third transistors through one of said second word lines to transfer binary data on said flip-flop circuits, connected to said one of said second word lines, to said second bit lines;

an input-output circuit connected to said second bit lines to precharge said second bit lines in synchronism with a clock signal and then detect the data transferred to said second bit lines from said flip-flop circuits; and a plurality of fourth transistors each of which is interposed between each of said second bit lines and a corresponding one of said flip-flop circuits in series with said second and third transistors, said fourth transistor being turned on or off in synchronism with said clock signal.

10. The memory of claim 9 wherein said fourth transistors are turned on just after said precharging of said second bit lines.

11. The memory of claim 9 wherein said fourth transistors have gate terminals which receive an inverted clock signal obtained by inverting said clock signal.

12. The memory of claim 9 wherein each of said flip-flop circuits comprises a pair of inverters, an input of each of said inverters being connected to an output of the other of said inverters.

* * * * *